United States Patent
Archer, III et al.

(10) Patent No.: US 8,319,343 B2
(45) Date of Patent: Nov. 27, 2012

(54) ROUTING UNDER BOND PAD FOR THE REPLACEMENT OF AN INTERCONNECT LAYER

(75) Inventors: Vance D. Archer, III, Greensboro, NC (US); Michael C. Ayukawa, Ecublens (CH); Mark A. Bachman, Sinking Springs, PA (US); Daniel P. Chesire, Winter Garden, FL (US); Seung H. Kang, Sinking Springs, PA (US); Taeho Kook, Orlando, FL (US); Sailesh M. Merchant, Macungie, PA (US); Kurt G. Steiner, Foglesville, PA (US)

(73) Assignee: Agere Systems LLC, Wilmington, DE (US)

( * ) Notice: Subject to any disclaimer, the term of this patent is extended or adjusted under 35 U.S.C. 154(b) by 381 days.

(21) Appl. No.: 11/469,960

(22) Filed: Sep. 5, 2006

(65) Prior Publication Data

US 2007/0063352 A1    Mar. 22, 2007

Related U.S. Application Data

(60) Provisional application No. 60/719,234, filed on Sep. 21, 2005.

(51) Int. Cl.
*H01L 23/48* (2006.01)
(52) U.S. Cl. .. 257/765; 257/760; 257/762; 257/E21.522
(58) Field of Classification Search .................. 257/765, 257/760, 762, 771, 781, E21.552
See application file for complete search history.

(56) References Cited

U.S. PATENT DOCUMENTS

| | | | |
|---|---|---|---|
| 5,106,461 A * | 4/1992 | Volfson et al. | 205/125 |
| 5,128,737 A * | 7/1992 | van der Have | 257/503 |
| 5,248,903 A | 9/1993 | Heim | |
| 5,656,858 A | 8/1997 | Kondo et al. | |
| 5,659,201 A * | 8/1997 | Wollesen | 257/758 |
| 5,751,065 A | 5/1998 | Chittipeddi et al. | |
| 5,854,514 A | 12/1998 | Roldan et al. | |
| 6,037,664 A | 3/2000 | Zhao et al. | |
| 6,187,680 B1 | 2/2001 | Costrini et al. | |
| 6,306,750 B1 | 10/2001 | Huang et al. | |
| 6,350,705 B1 * | 2/2002 | Lin | 438/779 |
| 6,426,556 B1 | 7/2002 | Lin | |
| 6,440,833 B1 * | 8/2002 | Lee et al. | 438/601 |

(Continued)

FOREIGN PATENT DOCUMENTS

JP    2001274162 A    10/2001

(Continued)

OTHER PUBLICATIONS

Office Action issued by the Chinese Patent Office dated Sep. 28, 2008 for Chinese Application No. 200610154052.X; 9 pages.

*Primary Examiner* — Thinh T Nguyen (57) ABSTRACT

The present invention provides a solder bump structure. In one aspect, the solder bump structure is utilized in a semiconductor device, such as an integrated circuit. The semiconductor device comprises active devices located over a semiconductor substrate, interconnect layers comprising copper formed over the active devices, and an outermost metallization layer positioned over the interconnect layers. The outermost metallization layer comprises aluminum and includes at least one bond pad and at least one interconnect runner each electrically connected to an interconnect layer. An under bump metallization layer (UBM) is located over the bond pad, and a solder bump is located over the UBM.

10 Claims, 7 Drawing Sheets

U.S. PATENT DOCUMENTS

| | | | |
|---|---|---|---|
| 6,563,216 B1 | 5/2003 | Kimura et al. | |
| 6,614,091 B1 * | 9/2003 | Downey et al. | 257/499 |
| 6,620,720 B1 | 9/2003 | Moyer et al. | |
| 6,642,597 B1 | 11/2003 | Burke et al. | |
| 6,656,826 B2 | 12/2003 | Ishimaru | |
| 6,664,578 B2 | 12/2003 | Lee et al. | |
| 6,689,680 B2 * | 2/2004 | Greer | 438/614 |
| 6,696,357 B2 | 2/2004 | Imai et al. | |
| 6,717,270 B1 * | 4/2004 | Downey et al. | 257/758 |
| 6,743,979 B1 | 6/2004 | Berman et al. | |
| 6,798,035 B1 | 9/2004 | Low et al. | |
| 6,825,563 B1 | 11/2004 | Ranganathan et al. | |
| 6,841,872 B1 | 1/2005 | Ha et al. | |
| 6,844,631 B2 * | 1/2005 | Yong et al. | 257/786 |
| 6,909,191 B2 | 6/2005 | Hatano et al. | |
| 7,019,398 B2 | 3/2006 | Matsuo | |
| 7,049,170 B2 | 5/2006 | Savastiouk et al. | |
| 7,160,805 B1 | 1/2007 | Burke et al. | |
| 7,242,099 B2 | 7/2007 | Lin et al. | |
| 7,301,231 B2 | 11/2007 | Antol et al. | |
| 7,364,998 B2 | 4/2008 | Chiu et al. | |
| 2001/0051426 A1 | 12/2001 | Pozder et al. | |
| 2003/0127502 A1 | 7/2003 | Alvarez | |
| 2003/0222348 A1 | 12/2003 | Okada | |
| 2004/0036174 A1 * | 2/2004 | Downey et al. | 257/758 |
| 2004/0134974 A1 | 7/2004 | Oh et al. | |
| 2004/0201101 A1 * | 10/2004 | Kang et al. | 257/758 |
| 2006/0006552 A1 | 1/2006 | Kang et al. | |
| 2007/0069394 A1 | 3/2007 | Bachman et al. | |

FOREIGN PATENT DOCUMENTS

| | | |
|---|---|---|
| JP | 2002110799 A | 4/2002 |
| JP | 200368740 A | 3/2003 |
| JP | 03079434 A2 | 9/2003 |
| JP | 200422869 A | 1/2004 |

* cited by examiner

ROUTING UNDER BOND PAD FOR THE REPLACEMENT OF AN INTERCONNECT LAYER

CROSS-REFERENCE TO RELATED APPLICATIONS

This application claims the benefit of U.S. Provisional Application No. 60/719,234 entitled "NOVEL ROUTING UNDER ALUMINUM BOND PAD FOR THE REPLACEMENT OF ONE COPPER METAL INTERCONNECT LAYER" to Vance D. Archer, et al., filed on Sep. 21, 2005, which is commonly assigned with the present invention and incorporated herein by reference as if reproduced herein in its entirety.

TECHNICAL FIELD OF THE INVENTION

The present invention is directed, in general, to a semiconductor device and, more specifically, to a semiconductor device that uses a novel routing under bond pad structure that replaces an interconnect layer.

BACKGROUND OF THE INVENTION

With decreasing feature sizes, the need has arisen in the semiconductor integrated circuit industry to move from aluminum (Al) or Al-alloy interconnects to copper (Cu) based metallization layers. Multilevel structures, containing up to 10 levels of Cu interconnect are common in today's devices. Copper has lower resistivity than Al-based alloys, and when used in conjunction with low-k dielectrics, Cu reduces RC interconnect delays. Moreover, Cu-based interconnects exhibit better reliability over Al-based alloys.

Figure 1:
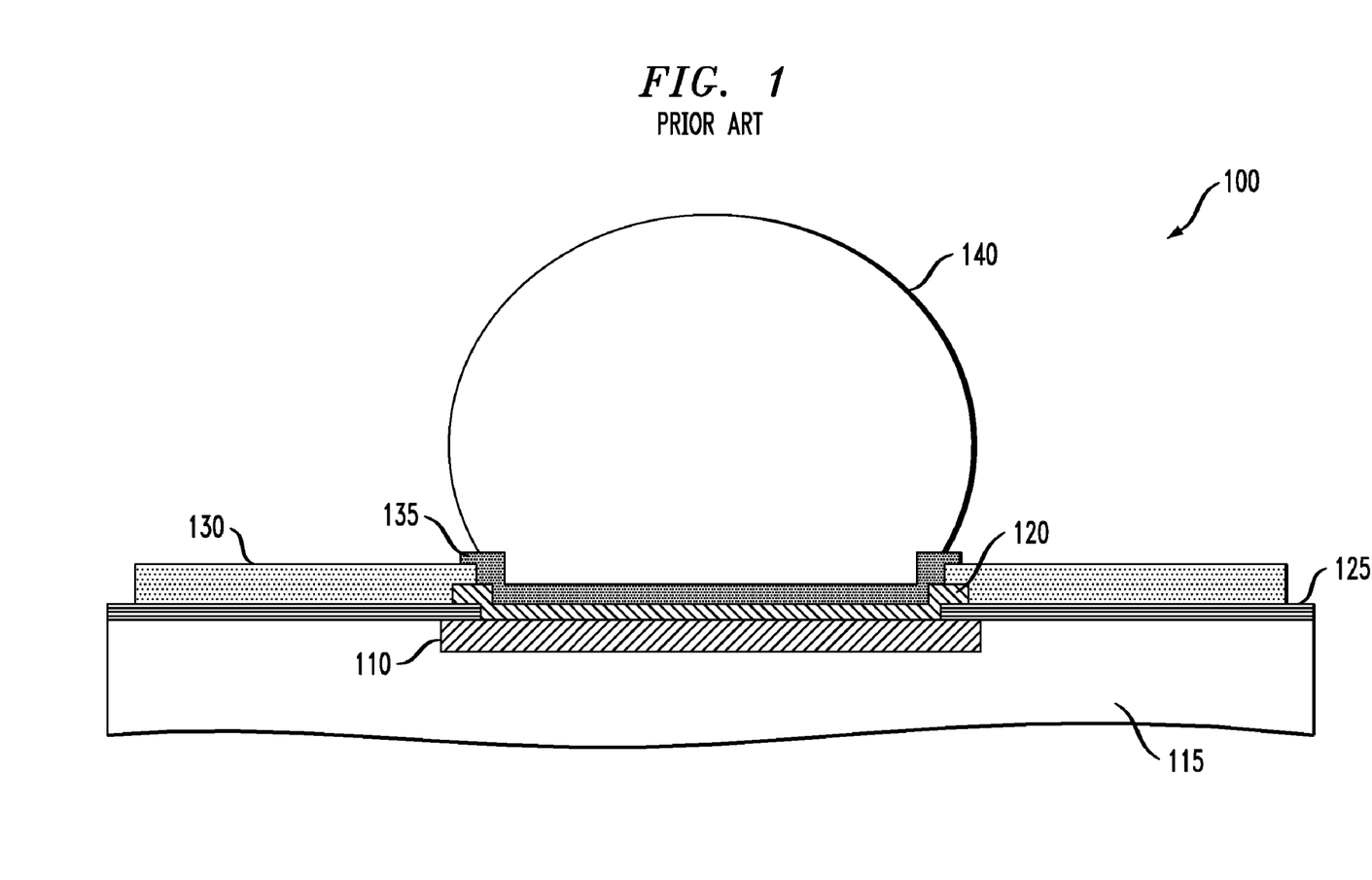
FIG. 1 illustrates a partial view of a solder bump structure of the prior art.

The uppermost levels of interconnects typically do not contain low-k dielectrics because of their poor mechanical and chemical stability. These materials have poor strength and low resistance to indentation and shear, and they are inherently brittle. Thus they are unsuitable for wire bonding or flip chip assembly techniques. Therefore, the industry fabricates microelectronic devices with the uppermost (or top two) Cu metallization layers formed within a conventional $SiO_2$-based dielectric. Moreover, the uppermost Cu metal layer has to be passivated with barrier dielectrics such as silicon nitride, silicon dioxide, silicon oxynitride ($SiN/SiO_2/SiON$), or combinations thereof. A conventional semiconductor device 100 is shown in FIG. 1, where a large Cu bond pad 110 is shown as part of a final or outermost Cu interconnect layer that is formed in an outermost dielectric layer 115. Other semiconductors features of the device, such as gates and interconnect layers have been omitted for clarity.

Devices with a large number of I/Os are typically fabricated with flip chip assembly techniques. Since direct bumping to Cu is not commonly available from most commercial assembly operations, it is a commonplace method of fabricating flip chip devices, containing Cu interconnects, to fabricate an Al-alloy bond pad 120 is located over the Cu bond pad 110 in the uppermost level of copper metallization, prior to fabricating the flip chip bump. The Al-alloy bond pad 120 is fabricated subsequent to the formation of a wafer passivation layer 125 that partially covers the Cu bond pad 110, as shown in FIG. 1. A barrier layer (not shown) typically separates the Al-alloy bond pad 120 from the copper bond pad 110. A final passivation layer 130 is deposited thereover. The passivation layer 130 is patterned to allow electrical connection to the Al-alloy bond pad 120. An under bump metallization (UBM) layer 135 is located over the Al-alloy bond pad 120. As is well known in the art, the UBM layer 135 separates the Al-alloy bond pad 120 from a solder bump 140. The Al-alloy bond pad 120 is electrically connected to underlying active components of the semiconductor device through the Cu bond pad 110, which in turn is electrically connected to an underlying interconnect metallization layer (not shown). Thus, as seen from the structure that is shown in FIG. 1, an additional interconnect metallization layer (i.e., the Cu bond pad 110) is required to electrically connect the Al-alloy bond pad 120 with underlying active devices. The fabrication of the Cu bond pad 110 requires additional processing and masking steps, which increase manufacturing costs.

What is needed in the art is a semiconductor device that has an improved bond pad structure that addresses the deficiencies of the above-discussed conventional structure.

SUMMARY OF THE INVENTION

To address the above-discussed deficiencies of the prior art, the invention provides, in one embodiment, a semiconductor device that comprises an aluminum layer including at least one bond pad and at least one interconnect runner, wherein the interconnect runner is electrically coupled to an underlying copper interconnect layer.

In another embodiment, the invention provides a semiconductor device that comprises active devices located over a semiconductor substrate, an outermost interconnect layer segmented into at least first and second runner portions and formed over the active devices, and a segmented bond pad layer positioned over the interconnect layer. The bond pad layer comprises a bond pad portion and an interconnect runner portion. The device further comprises a passivation layer that is located between the outermost interconnect layer and the bond pad layer. The passivation layer has vias that extend through it and contact the interconnect layer. The bond pad and interconnect runner portions extend into the vias. The bond pad portion is electrically connected to the first portion by at least one of the vias, and the interconnect runner portion is electrically connected to the second portion by at least one of another of the vias. An under bump metallization (UBM) layer located over the bond pad portion.

In another embodiment the invention provides an integrated circuit (IC) that comprises transistors located over a semiconductor substrate, dielectric layers located over the transistors, interconnect layers comprising copper formed over the transistors and within the dielectric layers, and an outermost metallization layer positioned over the interconnect layers. The outermost metallization layer comprises Al and is divided into a plurality of bond pads and a plurality of interconnect runners each electrically connected to an outermost interconnect layer.

In another embodiment, there is provided a method of manufacturing a semiconductor device, comprising forming a copper interconnect layer over a substrate, and forming an aluminum layer including at least one bond pad and at least one interconnect runner over the copper interconnect layer, wherein the interconnect runner is electrically coupled to the copper interconnect layer.

In another embodiment, the invention provides a semiconductor device that comprises active devices located over a semiconductor substrate, interconnect layers comprising copper formed over the active devices, and an outermost metallization layer positioned over the interconnect layers. The outermost metallization layer comprises aluminum and includes at least one bond pad and at least one interconnect runner each electrically connected to an interconnect layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

According to the present invention it is advantageous to replace one or more levels of the outermost interconnect metallization layers of a semiconductor device with a bond pad interconnect layer. The bond pad interconnect layer not only provides electrical connections for bond pad purposes, but it also provides general electrical connections for other electrical functions of the semiconductor device. This saves significant wafer processing costs and attendant yield losses. It is now proposed to effect this replacement by using the bond pad layer as a interconnect layer while also eliminating the outermost interconnect metallization layer. A novel routing layout is provided, which eliminates the final interconnect metal layer.

Figure 2A:
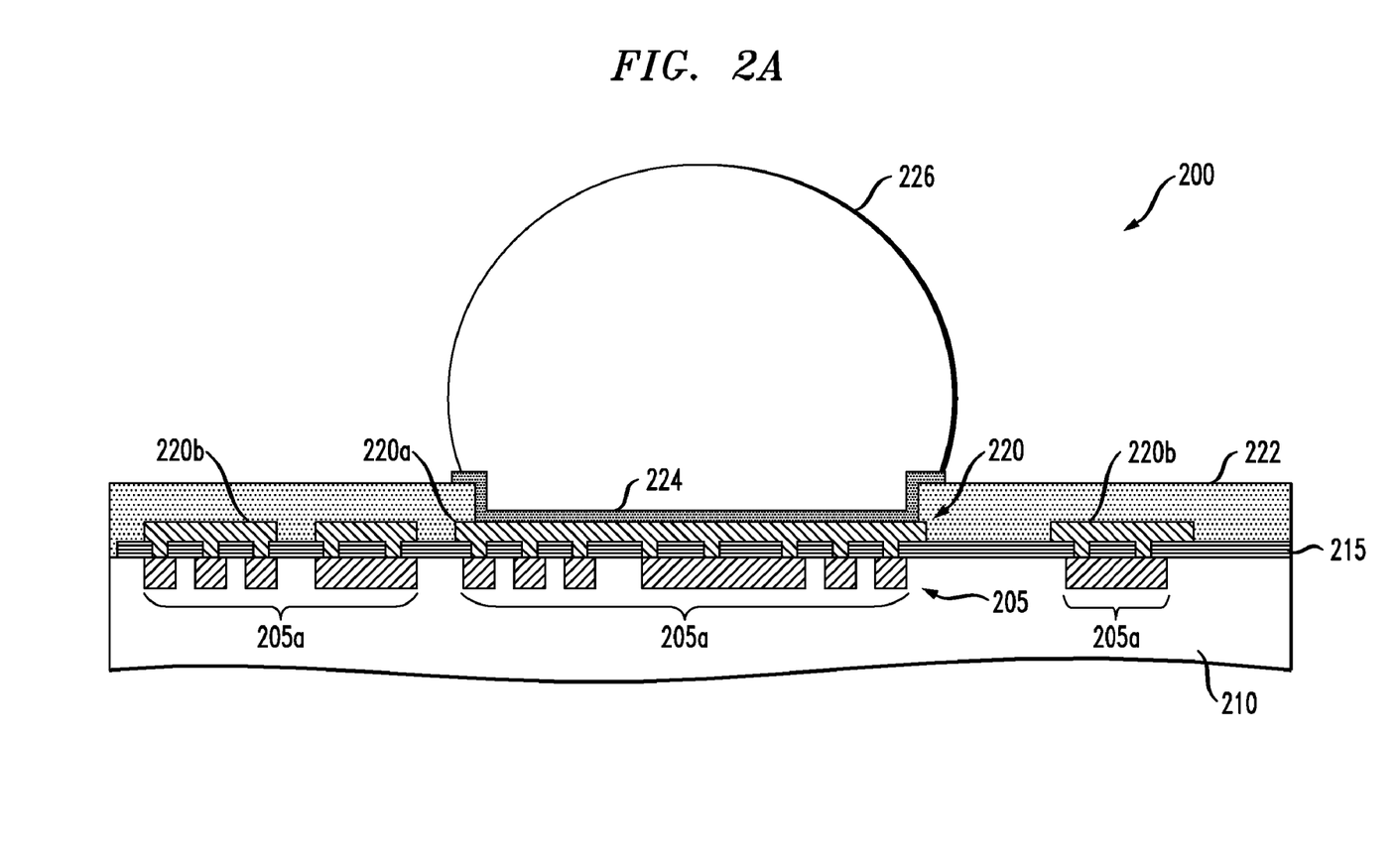
FIGS. 2A-2I illustrate a partial views of a solder bump structure provided by the invention and various stages of manufacture of the solder bump structure.

In FIG. 2A, one advantageous embodiment of a bond pad structure 200 according to the invention is shown that may be used in a semiconductor device. This embodiment includes an outermost interconnect layer 205, or level, located within a dielectric layer 210. The interconnect layer 205 has been patterned and segmented into a plurality of interconnects or runners 205a, (also known as metal lines). As used herein, it should be understood that a layer may be a single layer or a stack of layers. These runners 205a extend along the dielectric layer 210 and make connections through vias to underlying metal levels (not shown). Located over the interconnect layer 205 is a passivation layer 215. The passivation layer 215 has been patterned to form vias through it. The vias contact the various underlying runners 205a. A bond pad layer 220 is located over the passivation layer 215 and is segmented or divided and forms a bond pad portion 220a and at least one interconnect or runner portion 220b. A final passivation layer 222 is located partially over the bond pad 220a and located over runner portions 220b. A UMB layer 224 is located over the bond pad portion 220a, and a solder bump 226 is located over the UBM 224. In the embodiment illustrated in FIG. 2A, two runner portions 220b and one bond pad portion 220a are shown, however, in other embodiments, there may be more than one bond pad portion 220a and there may be one or more than two runner portions 220b. A barrier layer/layers preventing the inter diffusion of materials comprising regions 205a and 220a and 220b is not shown for clarity.

As seen in the foregoing embodiment, the bond pad structure 200 of the invention provides a structure that eliminates an entire metallization level and still achieves the required degree of electrical connectivity. In addition, the bond pad structure 200 utilizes the segmented bond pad layer 220 to not only provide electrical connections for purposes of the bond pad, but also provide a general interconnect for other electrical functions within the semiconductor device. This is achieved through the bond pad portion 220a and the runner portions 220b that connect directly to an underlying interconnect layer 205. With a general structure of one embodiment of the bond pad structure 200 having been generally described, one method of fabricating the device will now be discussed.

Figure 2B:
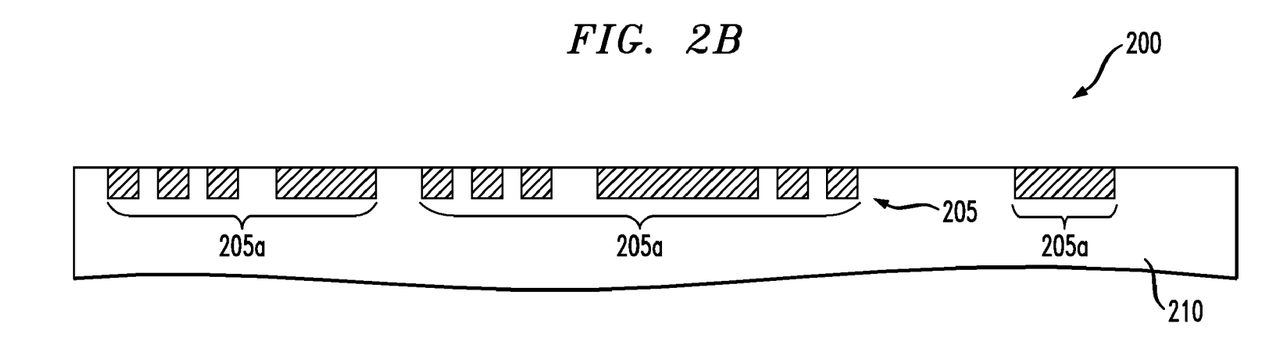

FIG. 2B illustrates the structure 200 of FIG. 2A at one stage of manufacture. In this embodiment, lower interconnect layers and active devices (not shown) have been formed. Thus, FIG. 2B illustrates the outermost interconnect layer 205 of the bond pad structure 200 formed within the dielectric layer 210. The interconnect layer 205 that is shown may be formed using conventional processes and materials. For example, the interconnect layer 205 may be formed using a damascene or dual damascene fabrication process that results in runner portions 205a of the interconnect layer 205. In such embodiments, the dielectric layer 210 is patterned to form openings or trenches in the dielectric layer 210 using used conventional photolithographic and etch processes.

A conductive metal is then deposited into the openings or trenches and the excess metal is removed using conventional chemical/mechanical polishing (CMP) processes. Typically, the trenches or openings are lined with a conventional barrier layer or layers (not shown), such as tantalum/tantalum nitride (Ta/TaN) or titanium/titanium nitride (Ti/TiN). In an advantageous embodiment, the conductive metal comprises copper or alloys thereof. It should be noted that other conventional interconnect structures may also be employed in the invention. For example, in some instances, the interconnect structure may comprise metal runners located on top of the dielectric layer that are connected to underlying structures by vias.

Figure 2C:
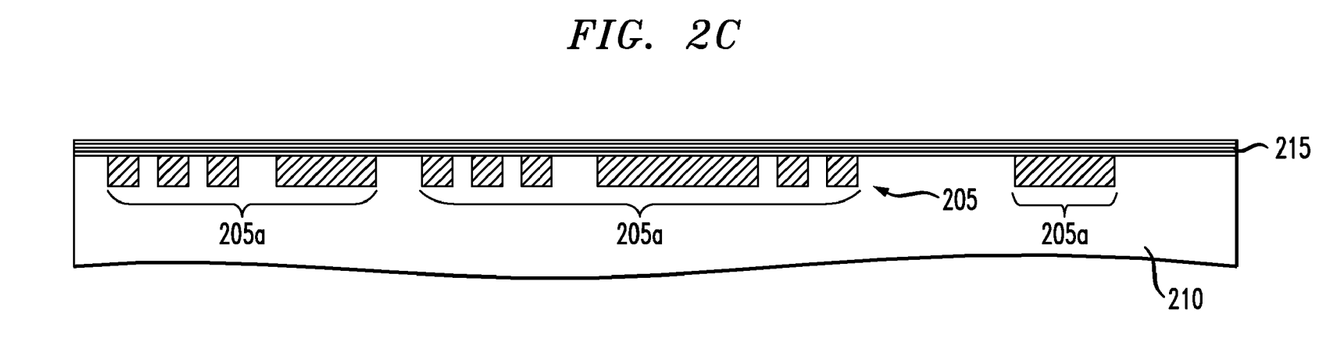

Following the planarization of the interconnect layer 205, the passivation layer 215 is deposited over the interconnect layer 205, as illustrated in FIG. 2C. Conventional deposition processes and materials may be used to form the passivation layer 215 and may comprise a single layer or a stack of layers, which is the embodiment that is shown. For example, the passivation layer 215 may be comprised of stacked layers of silicon nitride, silicon dioxide, silicon nitride, silicon carbonitride, silicon oxycarbide, silicon oxynitride, or combinations thereof that are deposited using conventional processes. While the illustrated embodiment shows the passivation layer 215 located directly on the dielectric layer 210 and interconnect layer 205, in other embodiments, there may be intervening layers located between the two.

Figure 2D:
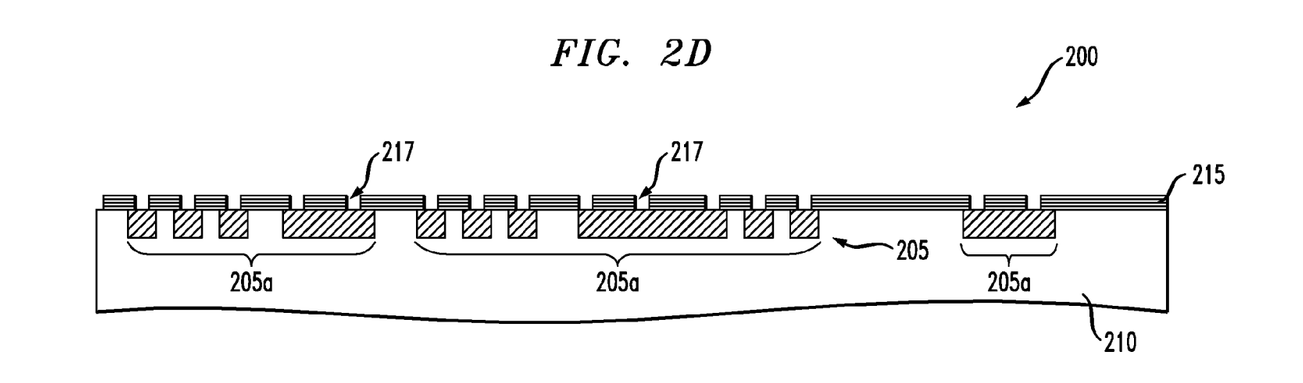

In the invention, the passivation layer 215 is patterned in a unique way, that is, it is patterned to open vias 217 (only two which have been designated for clarity) onto the underlying runners 205a, as shown in FIG. 2D. For connection purposes, a typical via diameter size will range between 0.5 and 10 microns, preferably about 3 microns in diameter. In another embodiment, the openings are a series of trenches, (e.g., having a 3 micron trench width). Those skilled in the art will recognize that the concept is what is conveyed in this disclosure, and not the actual dimensions of the openings. Those dimensions will vary with the device conductor geometries, shapes and sizes.

The patterning of the passivation layer 215 is unlike conventional processes and structures. In conventional processes, the passivation layer 215 is usually patterned over a copper pad and typically for the purpose of depositing Al therein to form an electrical connection between the copper pad and the solder bump. Here, however, the passivation layer 215 is divided or segmented such that the vias open onto different runners 205a that will ultimately serve has part of the overall interconnect structure. After the formation of the vias, a conventional barrier layer, such as Ti/TiN or Ta/TaN, or combinations thereof may be deposited therein. This aspect of the invention is not shown, but it should be understood that such barrier layers may be present.

Figure 2E:
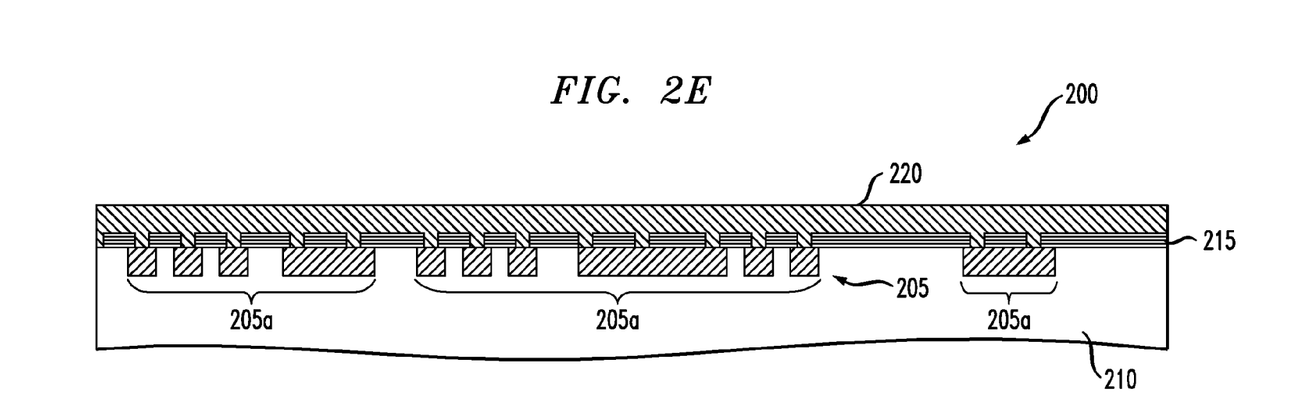

In FIG. 2E, the bond pad layer 220 is then deposited over the passivation layer 215 and into the vias and over the barrier layer, if present. The portion of the bond pad layer 220 that is located within the via, including the barrier layer, provides electrical connection between the various interconnect runners 205a and the bond pad layer 220. Conventional processes and materials may be used to form the bond pad layer 220. For example, in an advantageous embodiment, the bond pad layer 220 comprises Al or alloys thereof and deposition processes, such as physical vapor deposition (PVD) or chemical vapor deposition (CVD) or atomic layer deposition (ALD), processes may be used to form the bond pad layer 220 to the appropriate thickness.

Figure 2F:
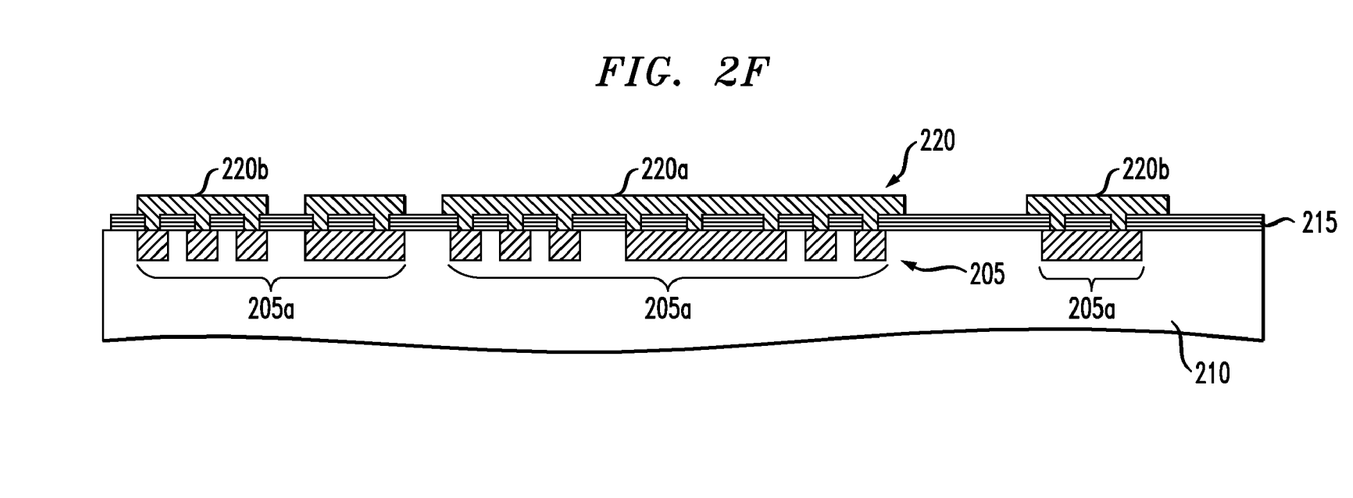

A conventional lithographic and etching process may then be used to uniquely pattern the bond pad layer 220 into a bond pad portion 220a and runner portions 220b, as shown in FIG. 2F. The selected etch chemistry will depend on the type of metal that is selected for the bond pad layer 220. Those who are skilled in the art would understand what etch chemistries to use. In the illustrated embodiment, the bond pad portion 220a provides electrical connection to the underlying interconnect runners 205a for bonding purposes, and the runner portions 220b provide electrical connection to the underlying interconnect runners 205a for general interconnect purposes.

Figure 2G:
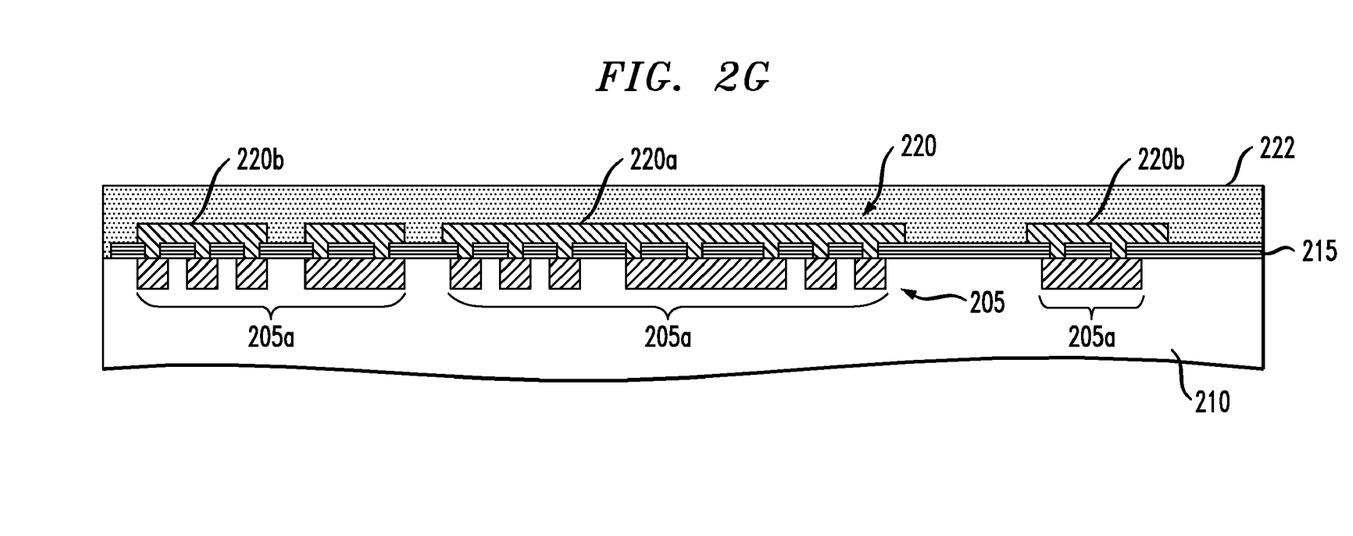
Figure 2H:
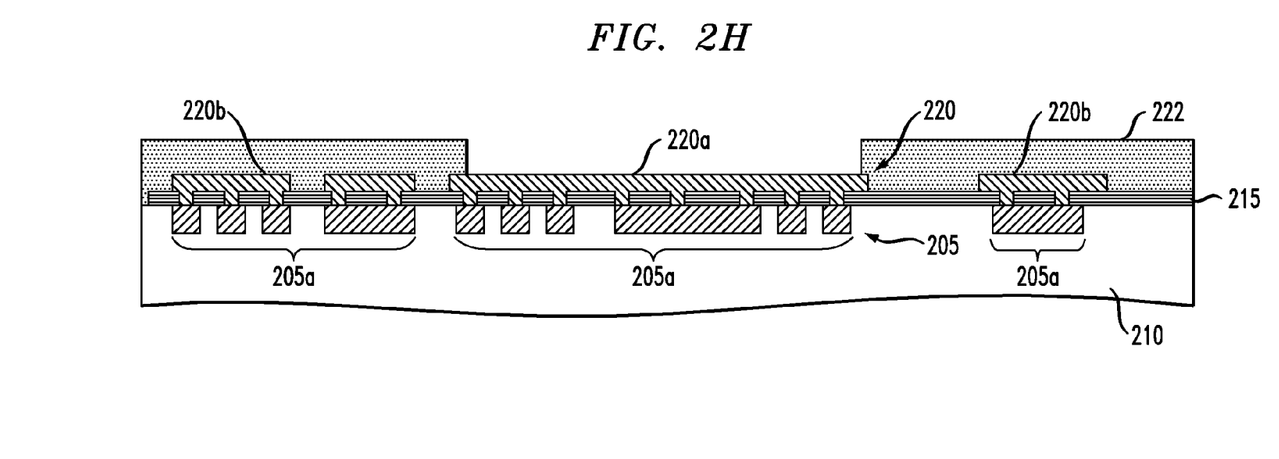

A second passivation layer 222, which may be a final wafer passivation layer is this then blanket deposited over the patterned bond pad layer 220 as seen in FIG. 2G. Conventional processes and material may be used to deposit the second passivation layer 222. For example, the second passivation layer 222 may be comprised of an oxide/nitride bilayer deposited with conventional PVD or CVD processes. The second passivation layer 222 is then patterned to expose part of the underlying bond portion 220a that will receive the subsequently deposited UBM and solder bump, while covering the runner portions 220b. Conventional etch processes may be used to pattern the second passivation layer 222.

Figure 2I:
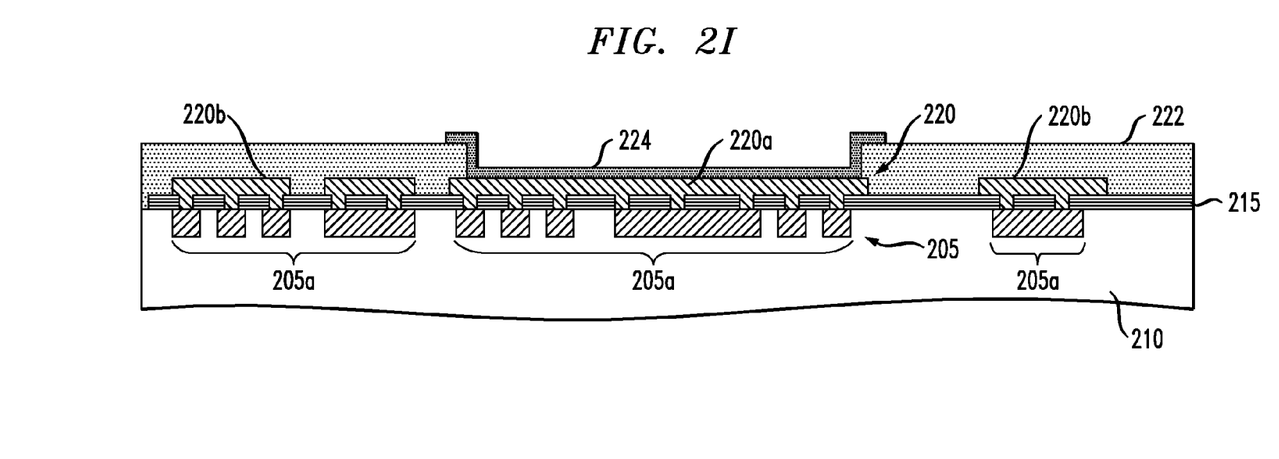

In FIG. 2I, the UBM layer 224 is deposited and patterned to arrive at the illustrated embodiment. Conventional processes, such as CVD, PVD or ALD and materials may be used to form the UBM layer 224. For example, the UBM layer 224 may comprise a metal, such as titanium, nickel/vanadium-copper, or copper/chromium, and a wet etch may be conducted to form the UBM structure 224. Following the deposition and patterning of the UBM layer 224, the solder bump 226 is then conventionally fabricated to arrive at the structure 200 shown in FIG. 2A.

Figure 3:
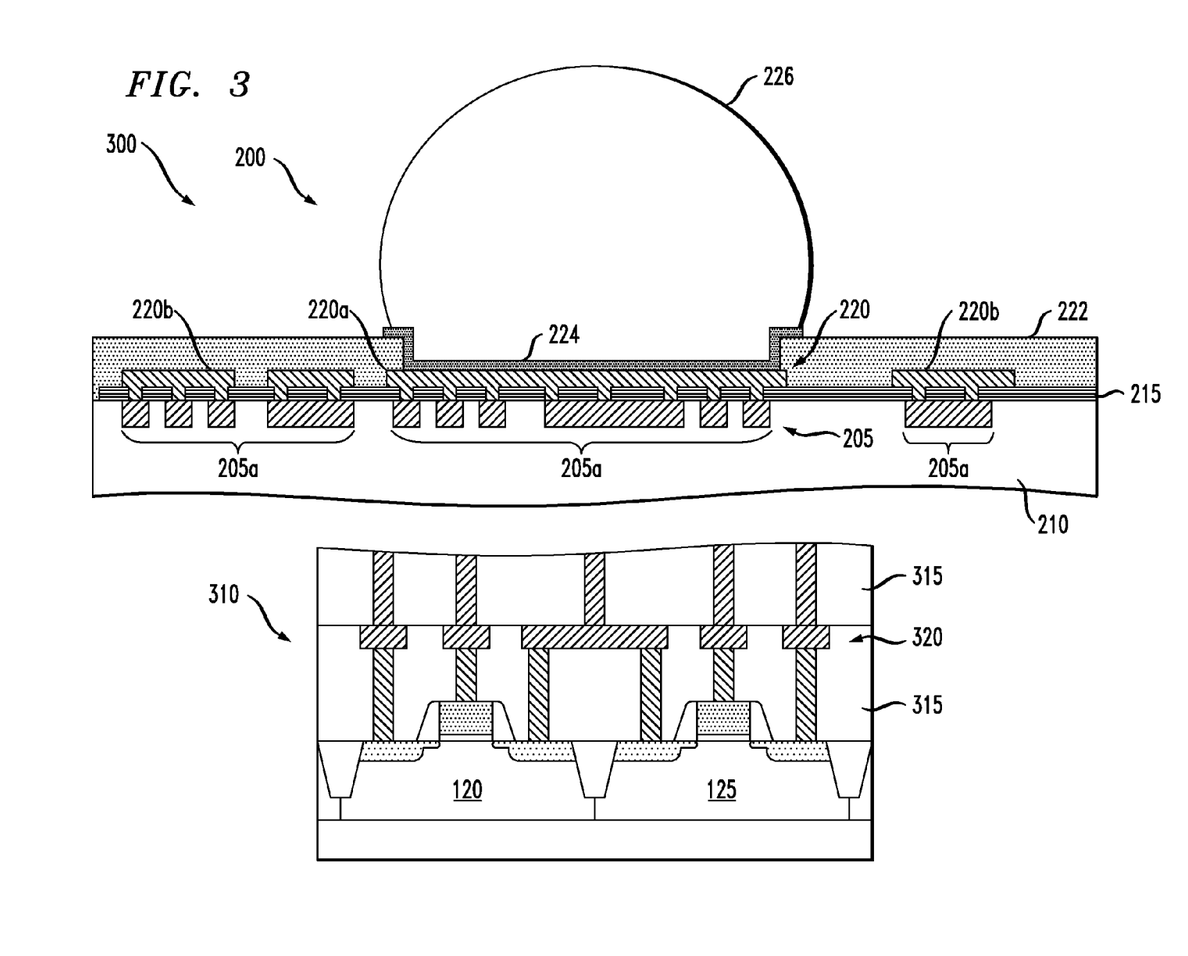
FIG. 3 illustrates a partial view of an IC in which the solder bump structure of the invention may be employed.

Turning briefly to FIG. 3, there is illustrated a partial view of a semiconductor device, such as an integrated circuit (IC) 300, for example a flip chip IC, that comprises the solder bump structure 200 illustrated in FIG. 2A. The solder bump structure 200 is electrically connected to underlying transistor structures 310. The IC 300 may be of conventional design; thus, a detailed discussion of its fabrication is not necessary. Further, the IC 300 is not limited to any particular device or design. For example, it may be an optoelectronics device or an electromechanical device. The transistors 310 are electrically connected to the solder bump structure 200, including the bond pad 220a and the runners 220b. The electrical connections between the transistors 310 and the solder bump structure 200 are not shown, but those who are skilled in the art would understand how the devices would be electrically connected. The solder bump structure 200 is located over dielectric layers 315 in which interconnects 320 are formed. The interconnects 320 may be of conventional design, such as a damascene or dual damascene interconnect structures. Those skilled in the art will understand that solder bump structure 200 may comprise lead or it alloys. Alternatively, it may be substantially lead-free (that is contain less than trace amounts of lead, e.g., less than 0.5%) and contain lead-free alloys known to those skilled in the art.

Although the present invention has been described in detail, those skilled in the art should understand that they can make various changes, substitutions and alterations herein without departing from the spirit and scope of the invention in its broadest form.

What is claimed is:

1. A semiconductor device, comprising:
    a bond pad layer, comprising aluminum or an alloy thereof and including at least one bond pad segment and at least one interconnect runner segment, wherein the at least one interconnect runner segment and the at least one bond pad segment are located on a same level within the semiconductor device and extend through openings in a first passivation layer located under the bond pad layer to at least one copper runner segment of a final metallization layer located under the passivation layer and to electrically couple the at least one interconnect runner segment and the at least one bond pad segment to different portions of the final metallization layer;
    a second passivation layer located over the first passivation layer and the bond pad layer the second passivation layer having a solder bump opening located therein that exposes the bond pad segment; and
    an under bump metallization (UBM) layer located in the solder bump opening and physically, contacting the exposed bond bad segment.

2. The device recited in claim 1, wherein a solder bump is located on the UBM layer.

3. The device recited in claim 2, wherein the solder bump comprises lead or its alloys or is lead-free.

4. The device recited in claim 1, wherein the at least one bond pad segment extends through a plurality of openings in the first segmented passivation layer and contacts a first segment of the final metallization layer and the at least one interconnect runner segment extends through another plurality of openings in the first segmented passivation layer and contacts a second segment of the final metallization layer, wherein a material layer is located between the first and second segments of the copper interconnect layer.

5. The device recited in claim 1, wherein the final metallization layer comprises a copper alloy.

6. A semiconductor device, comprising:
    a final interconnect segmented metal layer;
    a first passivation layer located on the final interconnect segmented metal layer and having openings extending therethrough to portions of the final interconnect segmented metal layer;
    a segmented bond pad layer segmented into at least one interconnect runner segment and at least one bond pad segment and wherein the segmented bond pad layer is located on the first passivation layer and wherein the at least one interconnect runner segment and the at least one bond pad segment extend through the openings to the final interconnect segmented metal layer, to thereby make connection with the final interconnect segmented metal layer;

a second passivation layer located on the segmented bond pad layer and the segmented first passivation layer and having an under bump metallization opening formed therein and exposing a portion of the at least one bond pad segment; and an under bump metallization layer located within the opening of the second passivation layer and on the at least one bond pad segment.

7. The device recited in claim 6, wherein the segmented bond pad layer comprises aluminum.

8. The device recited in claim 6, wherein the segmented first passivation layer comprises silicon nitride.

9. The device recited in claim 6, wherein the segmented second passivation layer comprises oxide/nitride.

10. The device recited in claim 6, further including a solder bump located on the under bump metallization layer.

* * * * *